(12) United States Patent
Ichihara

(10) Patent No.: US 6,587,513 B1
(45) Date of Patent: Jul. 1, 2003

(54) PREDISTORTER

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/377,797

(22) Filed: Aug. 20, 1999

(30) Foreign Application Priority Data

Aug. 24, 1998 (JP) .......................................... 10-237428

(51) Int. Cl.$^7$ .......................... H04L 27/04; H04K 1/02; H03F 1/26
(52) U.S. Cl. ...................... 375/296; 375/295; 375/297; 330/149; 330/151
(58) Field of Search ................. 375/296, 297, 375/295; 330/149, 151

(56) References Cited

U.S. PATENT DOCUMENTS

| | | | |
|---|---|---|---|
| 4,291,277 A | 9/1981 | Davis et al. ................. | 330/149 |
| 5,193,224 A | 3/1993 | McNicol et al. ............. | 455/126 |
| 6,072,364 A | * 6/2000 | Jeckeln et al. .............. | 330/149 |
| 6,304,140 B1 | * 10/2001 | Thron et al. ................. | 330/149 |
| 6,437,644 B1 | * 8/2002 | Kenington ................. | 330/149 |

FOREIGN PATENT DOCUMENTS

| | | |
|---|---|---|
| EP | 0121446 | 10/1984 |
| EP | 0524008 | 1/1993 |
| EP | 0654898 | 5/1995 |
| JP | 64-18817 | 1/1989 |
| JP | 04-236509 | 8/1992 |
| JP | 4-275708 | 10/1992 |
| JP | 04-287457 | 10/1992 |
| JP | 08-251246 | 9/1996 |
| JP | 10-23095 | 1/1998 |
| JP | 10-098421 | 4/1998 |

OTHER PUBLICATIONS

L. Sundström, et al., "Quantization Analysis and Design of A Digital Predistortion Linearizer for RF Power Amplifiers", *IEEE Transactions on Vehicular Technology*, vol. 45, No. 4, Nov. 1996, pp. 707–719.

Japanese Office Action issued Mar. 6, 2002 (w/ English translation of relevant portions).

Japanese Office Action dated Jul. 17, 2002 with English translation.

* cited by examiner

*Primary Examiner*—Stephen Chin
*Assistant Examiner*—Sam Ahn
(74) *Attorney, Agent, or Firm*—Dickstein, Shapiro, Morin & Oshinsky, LLP.

(57) ABSTRACT

Disclosed is a predistorter for preliminarily compensating a distortion caused in a circuit comprising a modulator, a variable gain amplifier, and a non-linear amplifier, the predistorter comprising: an amplitude detector for detecting an amplitude of an input signal; a gain detector for detecting a gain of the variable gain amplifier; a first multiplier for multiplying the amplitude of the input signal with the gain of the variable gain to output a product therebetween; a generator for generating a predistortion function corresponding to the product; and a second multiplier for multiplying the input signal with the predistortion function to output a product therebetween to the modulator.

19 Claims, 6 Drawing Sheets

$sp = F(|sr|) \cdot sr$ $so = G(|sp|) \cdot sp = G(|sp|) \cdot F(|sr|) \cdot sr$ $\therefore c = G(|sp|) \cdot F(|sr|)$

PREDISTORTER

BACKGROUND OF THE INVENTION

1. Field of the Invention

The present invention relates to a predistorter and particularly, to the predistorter which has a variable gain circuit for power control.

2. Description of the Prior Art

A predistorter is conventionally used for the purpose of preliminarily compensating, at a baseband, a distortion caused in a transmission power amplifier of a radio communication apparatus, and thereby reducing a spurious radiation caused by a non-linearity of the transmission power amplifier. In the case where a predistorter is used in the radio communication apparatus, a transmission power amplifier can operate in a non-linear region and accordingly, the power consumption during transmission of the radio communication apparatus can be decreased. If the radio communication apparatus is a portable phone which uses a battery as its power source in such a case, a talk time can be elongated.

Predistorters as explained above have been developed actively heretofore. The theory and structure of a predistorter is explained in detail in "Quantization Analysis and Design of a Digital Predistortion Linearizer for RF Power Amplifier", Sundstrom L., Faulkner M., Johansen M.; Vehicular Technology, IEEE Trans. Vol. 45 4, pages 707–719.

A conventional predistorter will be explained hereunder while making reference to the above article.

In conventional mobile communications, it has been adopted a constant envelope modulation system such as FM system and GMSK system, in which an amplitude of a modulated signal is constant and information is carried on phase variation of the modulated signal. The reason for the adoption is that the constant amplitude enables the use of a C- or F-class non-linear amplifier which has a high power efficiency as a transmission power amplifier. In the case where a transmission power amplifier with a high power efficiency is used, the power consumption during a transmission is reduced and, if a portable phone is used, a talk time can be elongated.

Heretofore, however, increase in traffic has become a problem in mobile communication.

Hence, a modulation system with a high efficiency in frequency use also has been used. For example, PDC (personal Digital Cellular) and PHS (Personal Handyphone System) in Japan adopt π/4 shift QPSK. In addition, CDMA (Code Division Multiple Access) system adopts QPSK or offset QPSK.

These modulation systems are referred to as linear modulation systems, in which information is carried on amplitude as well as on phase. In such systems, a non-linear amplifier can not be adopted because the amplitude of a modulated signal varies within wide range. That is, it is needed to adopt an amplifier with a linearity as precise as possible.

FIG. 3 shows an example of an output spectrum in the case here an amplifier with a poor linearity is used.

A bold line in FIG. 3 represents an original spectrum in a linear modulation system. In the case where a modulated signal passes through an amplifier with a poor linearity, spurious signals with a bandwidth, for example, three times as wide as the original signal (or third order distortion components) represented by a broken line are generated because of the influence of the third order distortion of the amplifier.

In such case where the spurious signals are generated, ACPR (Adjacent Channel Power Ratio) becomes worse and accordingly, efficiency in frequency use is lowered in spite of adoption of a linear modulation system with high efficiency in frequency use. This phenomenon is referred to as Spectrum Re-generation.

In order to avoid this phenomenon, it is necessary to cause an amplifier to operate in a region where it's linearity is sufficiently precise.

However, the better the linearity of an amplifier is, the more the amplifier consumes a power and the lower the power efficiency thereof becomes.

Linealizers such as predistorter have been developed as means for alleviating such problem. That is, a countermeasure to this problem is to use an amplifier with high power efficiency and poor linearity and a predistorter for compensating the poor linearity, thereby suppressing spurious powers to adjacent channels.

FIG. 4 shows an example of a distortion of a transmission power amplifier.

As shown in FIG. 4, as an input level increases, a gain gradually decreases and input-output characteristics gradually deviate from a straight line and eventually saturate. In addition, phase characteristics deviate from a certain constant from a point close to where the input-output characteristics begin to deviate from the straight line.

An input signal is a complex number which has an amplitude and an angle (or phase) and represented as:

$$S_r = (I_r + jQ_r)\exp(j2\pi f_c t),$$

where $I_r$: an in-phase component of a baseband signal $Q_r$: a quadrature component of the baseband signal $f_c$: carrier frequency.

Here, in the case where $S_r$ is regarded as representing a baseband signal, the exponential part is omitted and the baseband signal is represented as:

$$S_r = I_r + jQ_r$$

In the case where the signal $S_r$ is inputted to an amplifier, the output level becomes $|S_o|'$ because of the distortion, though the output level should be $|S_o|$ originally. In addition, the phase shifts by $\theta_1$. This relation generates the Spectrum Re-generation, which deteriorates ACPR.

A predistorter is effective to avoid the above. In order to cause the amplifier to output the output level $S_o$, it is necessary to supply to the amplifier the input $S_p$ which has been preliminarily calculated instead of the input $S_r$.

FIG. 5 shows a complex plane for explaining the compensation of a distortion carried out by the predistorter.

As shown in FIG. 5, the predistorter needs to generate the signal $S_p$ which has an amplitude made higher than that of signal $S_r$ in consideration of the saturation of the characteristics of the amplifier and has a phase $\theta_2$ in a direction for canceling the phase rotation.

FIG. 6 is a diagram for explaining the formulation of the compensation of the distortion as shown in FIG. 5.

In FIG. 6, G represents the input-output characteristics of the amplifier and F represents the input-output characteristics of a predistorter. Both G and F include phase and are represented with complex numbers.

It is obvious from FIG. 6 that the signal $S_p$ which has been predistorted is represented as:

$$S_p = F(|S_r|) \cdot S_r$$

It is obvious that F is determined by only the amplitude of $S_r$ or the absolute value of $S_r$. The output $S_o$ of the amplifier is represented as:

$$S_o = G(|S_p|) \cdot S_p = G\{|F(|S_r|) \cdot S_r|\} \cdot F(|S_r|) \cdot S_r$$

In order to establish a linear relationship between $S_o$ and $S_r$, it is necessary to satisfy the following equation:

$$G\{|F(|S_r|) \cdot S_r|\} \cdot F(|S_r|) = C = \text{constant}$$

If an objective value of C, the characteristics G of the amplifier, and the input signal $S_r$ are determined, then the predistortion function F is determined by using the above equation. Here, the function F is represented with a complex number or with a real part Re and an imaginary part Im.

FIG. 7 shows the structure of an example of general adaptive predistorters. Here, an input signal (or a source signal) can be treated as a complex signal which has, in a real part, an in-phase component $I_r$ with respect to a carrier and, in an imaginary part, a quadrature component $Q_r$ with respect to the carrier.

This conventional predistorter comprises: look-up table 23 in which a real part Re and imaginary part Im of a predistortion function is stored and which outputs the function value F in response to the amplitude of the input signal used as an address thereof; complex multiplier 20 which multiplies the function value F with the input signal by complex multiplication; digital-to-analog converter 21 which converts the result of the multiplication in the complex multiplier 20 to an analog signal and outputs the analog signal; quadrature modulator 22 which modulates the analog signal supplied from digital-to-analog converter 21 by quadrature modulation and outputs a modulated signal as an RF (radio frequency) signal; non-linear amplifier 11 which amplifies the radio frequency signal and outputs an amplified RF signal; coupler 12 which shunts the amplified RF signal into two RF signals; antenna 13 which transmits one of the signals shunted by coupler 12 as a radio wave; quadrature demodulator 26 which demodulates the other of the signals shunted by coupler 12 by quadrature demodulation and outputs a demodulated signal as a complex baseband signal; analog-to-digital converter 25 which converts the baseband signal to a digital signal and output the digital signal; and adaptation circuit 24 which compares the digital signal outputted from analog-to-digital converter 25 with the input signal and updates look-up table 23 in accordance with the result of the comparison.

In the predistorter having the structure as explained above, the structure of adaptation circuit 24 becomes complicated because adaptation circuit 24 needs to have a function of comparing the demodulated signal and the input signal while adjusting the timing and phase therebetween. In addition, a transmission level from antenna 13 must be determined in accordance with the input signal.

On the other hand, it is necessary to vary transmission power within a range as wide as 80 dB in CDMA system in order to solve the near-far effect.

FIG. 8 shows the structure of another example of general adaptive predistorters.

Referring to FIG. 8, this conventional predistorter comprises: amplitude calculation circuit 15 which calculates an amplitude of an input signal using components $I_r$ and $Q_r$ of the input signal, ROM 14 in which a real part Re and imaginary part Im of a predistortion function are stored and which outputs the function value F in response to the amplitude of the input signal calculated in amplitude calculation circuit 15 and used as an address thereof; complex multiplier 20 which consists of four multipliers 1 through 4 and two adders 5 and 6 and multiplies the function F and the input signal by complex multiplication; digital-to-analog converters 7 and 8 which convert the results of the multiplication in complex multiplier 20 to analog signals and output the analog signals; quadrature modulator 9 which modulates the analog signals outputted from digital-to-analog converters 7 and 8 by quadrature modulation and outputs a modulated signal as an RF signal; variable gain amplifier 10 which amplifies the RF signal outputted from quadrature modulator 9 with a gain corresponding to a gain control signal supplied from the external and outputs the amplified RF signal; non-linear amplifier 11 which amplifies the RF signal outputted from variable gain amplifier 10 and outputs the RF signal amplified therein; and antenna 13 which transmits the RF signal outputted from non-linear amplifier 11 as a radio wave.

In the predistorter having the structure as explained above, the amplitude of the input signal is calculated in amplitude calculation circuit 15 using input components $I_r$ and $Q_r$, the value of function F is outputted from ROM 14 using the result of the calculation as an address, and the value of function F thus outputted and the input signal consisting of components $I_r$ and $Q_r$ are multiplied each other by complex multiplier 20.

Here, a transmission level from antenna 13 is determined not only by the input signal consisting of components $I_r$ and $Q_r$ but also by the gain control signal $G_c$ inputted to variable gain amplifier 10, because variable gain amplifier 10 is inserted between quadrature modulator 9 and non-linear amplifier 11.

In the latter conventional predistorter, there is a disadvantage that it is impossible to compensate a distortion accurately when the gain control signal varies because a transmission level from antenna 13 is determined by an amplitude of the input signal and a gain of variable gain amplifier 10 and the gain of variable gain amplifier 10 varies when the gain control signal varies.

Even if adaptation circuit 24 is introduced to the latter conventional predistorter, it is extremely difficult to stably perform adaptation operation because a predistortion is necessary only in a short period while a gain of variable gain amplifier 10 is high.

SUMMARY OF THE INVENTION

In order to overcome the aforementioned disadvantages, the present invention has been made and accordingly, has an object to provide a predistorter which correctly compensates a distortion of a non-linear amplifier even when a gain of a variable gain amplifier varies.

According to a first aspect of the present invention, there is provided a predistorter for preliminarily compensating a distortion caused in a circuit comprising a modulator, a variable gain amplifier, and a non-linear amplifier, the predistorter comprising: an amplitude detector for detecting an amplitude of an input signal; a gain detector for detecting a gain of the variable gain amplifier; a first multiplier for multiplying the amplitude of the input signal with the gain of the variable gain to output a product therebetween; a generator for generating a predistortion function corresponding to the product; and a second multiplier for multiplying the input signal with the predistortion function to output a product therebetween to the modulator.

According to a second aspect of the present invention, there is provided a method for preliminarily compensating a distortion caused in a circuit comprising a modulator, a variable gain amplifier, and a non-linear amplifier, the method comprising steps of: detecting an amplitude of an input signal; detecting a gain of the variable gain amplifier; multiplying the amplitude of the input signal with the gain of the variable gain to output a product therebetween; generating a predistortion function corresponding to the product; and multiplying the input signal with the predistortion function to output a product therebetween to the modulator.

According to a third aspect of the present invention, there is provided a transmitter comprising: the predistorter of the first aspect; a modulator for modulating an output of the predistorter; a variable gain amplifier for amplifying an output of the modulator; a non-linear amplifier for amplifying an output of the variable gain amplifier; and an antenna for transmitting an output of the non-linear amplifier as a radio wave.

According to a fourth aspect of the present invention, there is provided a radio communication apparatus comprising the transmitter of the third aspect.

These and other objects, features and advantages of the present invention will become more apparent in light of the following detailed description of the best mode embodiments thereof, as illustrated in the accompanying drawings.

DETAILED DESCRIPTION OF THE PREFERRED EMBODIMENTS

Preferred embodiments according to the present invention will be explained with reference to the accompanying drawings.

[First Embodiment]

Figure 1:
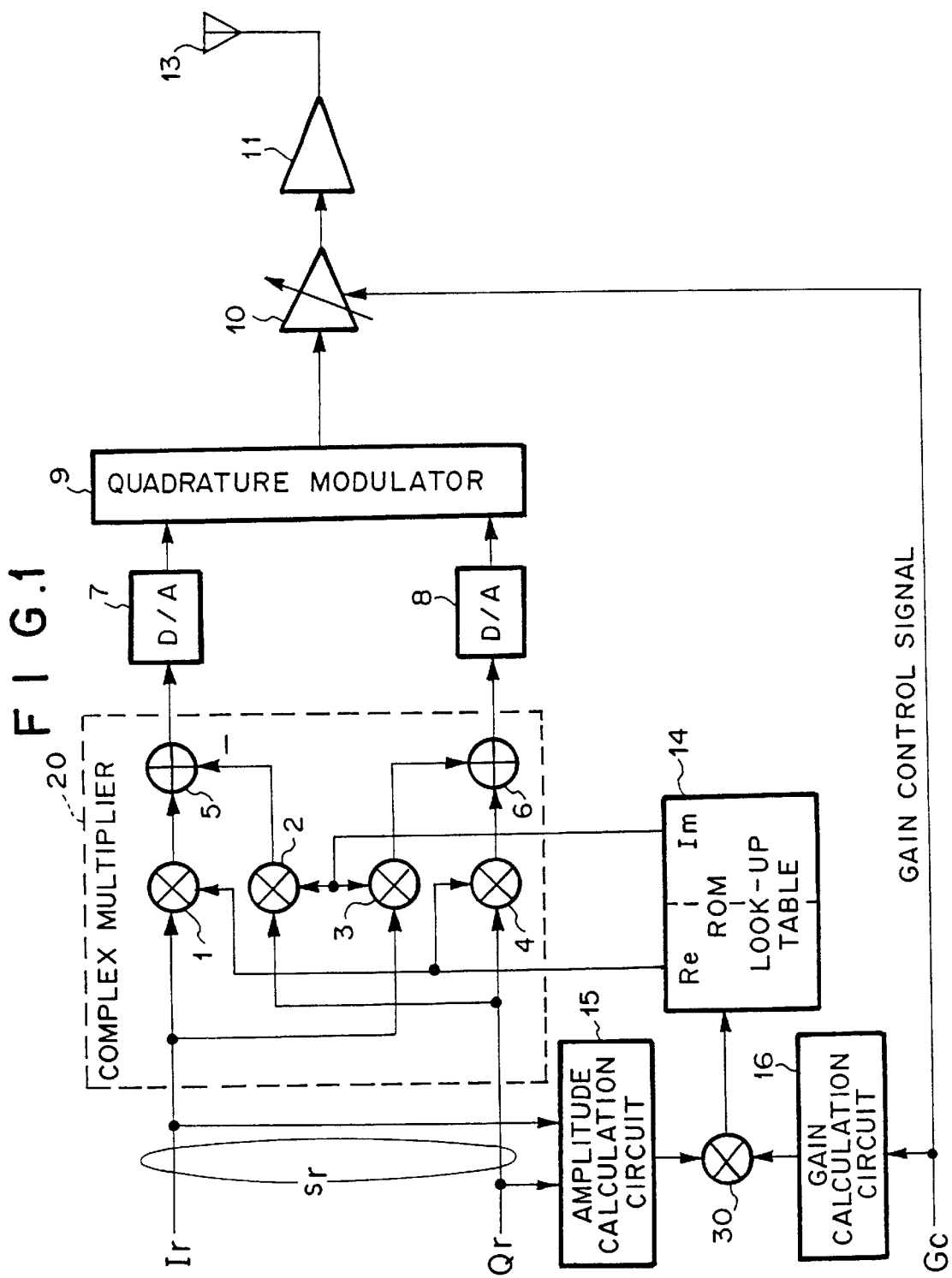
FIG. 1 is a block diagram showing a first embodiment of a predistorter according to the present invention.

As shown in FIG. 1, this embodiment comprises: amplitude calculation circuit 15 which calculates an amplitude of an input signal $S_r$ using a baseband signal $I_r$ which is an in-phase component of the input signal $S_r$ with respect to a transmission carrier and a baseband signal $Q_r$ which is a quadrature component of the input signal $S_r$ with respect to the transmission carrier; ROM 14 in which a real part Re and imaginary part Im of a predistortion function are stored and which outputs a prescribed distortion-compensating data; complex multiplier 20 which comprises four multipliers 1 through 4 and two adders 5 and 6 and which multiplies a distortion-compensating data outputted from ROM 14 with the input signal $S_r$ by complex multiplication; digital-to-analog converters 7 and 8, which convert a result of multiplication in complex multiplier 20 to analog signals and output the analog signals; quadrature modulator 9 which modulates the analog signals outputted from digital-to-analog converters 7 and 8 by quadrature modulation and outputs a modulated signal as an RF signal; variable gain amplifier 10 which amplifies the RF signal outputted from quadrature modulator 9 with a gain corresponding to a gain control signal supplied from the external and outputs the amplified RF signal; non-linear amplifier 11 which amplifies the amplified RF signal outputted from variable gain amplifier 10 and outputs an RF signal amplified therein; antenna 13 which transmits the RF signal outputted from non-linear amplifier 11 as a radio wave; gain calculation circuit 16 which inputs the gain control signal also inputted to variable gain amplifier 10 and which calculates the gain of variable gain amplifier 10 on the basis of the gain control signal; and multiplier 30 which multiplies the amplitude calculated in amplitude calculation circuit 15 with the gain calculated in gain calculation circuit 16. ROM 14 outputs the distortion-compensating data in response to the result of multiplication in multiplier 30 which is used an address thereof. Here, the input signal $S_r$ is a complex number consisting of a real part $I_r$ and an imaginary part $Q_r$.

An operation of the predistorter having the structure as explained above will be explained hereunder.

Amplitude calculation circuit 15 calculates an instantaneous amplitude $|S_r|$ of the input signal $S_r$ when the input signal Sr is (or the real part $I_r$ and the imaginary part $Q_r$ are) supplied to amplitude calculation circuit 15. $|S_r|$ is calculated by using the following equation:

$$|S_r|=(I_r^2+Q_r^2)^{1/2}$$

In addition, gain calculation circuit 16 calculates an actual value A of the gain of variable gain amplifier 10 on the basis of a value of the gain control signal $G_c$ supplied from the external.

Multiplier 30 multiplies the instantaneous amplitude of the input signal $S_r$ calculated in amplitude calculation circuit 15 with the value A of the gain of variable gain amplifier 10 calculated in gain calculation circuit 16. The result X of the multiplication is used as an address of ROM 14. Here, address X of ROM 14 is given by the following equation and is proportional to an instantaneous amplitude of a transmission power.

$$X=A \cdot |S_r|=A \cdot (I_r^2+Q_r^2)^{1/2}$$

Then, ROM 14 outputs the distortion-compensating data, the real part of which is Re and the imaginary part of which is Im, in response to address X.

Thereafter, complex multiplier 20 multiplies the input signal $S_r$ and the distortion-compensating data outputted from ROM 14 by complex multiplication.

Here, the result of multiplication in complex multiplier 20 is a complex number signal $S_p$ which is the input signal $S_r$ compensated in amplitude and phase so that a non-linearity of non-linear amplifier 11 is canceled. As a result of the multiplication, the signal $S_p$ becomes as follows:

$$S_p=(Re+jIm) \cdot S_r=(Re+jIm) \cdot (I_r+jQ_r)=(Re \cdot I_r-Im \cdot Q_r)+j(Re \cdot Q_r+Im \cdot I_r)$$

Here, the real part Re and the imaginary part Im are written as:

Re=α·cos θ

Im=α·sin θ

α: amplitude compensation factor

θ: phase compensation factor

Substituting the above equation pair to the equation of $S_p$, the $S_p$ is rewritten as:

$$S_p = S_r \cdot \alpha \cdot \exp(j\theta)$$

The above equation means that the compensated signal $S_p$ is obtained by multiplying the input signal $S_r$ with $\alpha$ in amplitude and rotating the input signal $S_r$ by $\theta$ in phase.

The real part $I_p$ and imaginary part $Q_p$ of the compensated signal $S_p$ are written as follows:

$$I_p = Re \cdot I_r - Im \cdot Q_r$$

$$Q_p = Re \cdot Q_r + Im \cdot I_r$$

The real part $I_p$ and the imaginary part $Q_p$ are converted to analog signals in digital-to-analog converters 7 and 8, and converted to an RF signal in quadrature modulator 9.

In CDMA system, a precise transmission power control is necessary in order to solve the near-far effect. Therefore, variable gain amplifier 10 is inserted between quadrature modulator 9 and non-linear amplifier 11 to precisely control transmission power.

The RF signal outputted from quadrature modulator 9 is amplified in variable gain amplifier 10 and the gain of variable gain amplifier 10 is controlled by the gain control signal Gc. It is usual that the gain control signal Gc has a voltage or control value which corresponds to, for example, is proportional to, a dB value of the gain of variable gain amplifier 10.

Thereafter, the signal amplified in variable gain amplifier 10 is also amplified in non-linear amplifier 11 and transmitted via antenna 13.

Here, both an amplitude distortion and phase distortion generated in non-linear amplifier 11 are determined by an amplitude of an input signal to non-linear amplifier 11. Therefore, if address X of ROM 14 is determined, then the distortion are also determined. That is, distortion compensation data Re and Im for compensation the distortions are uniquely determined.

Therefore, it is appropriate to measure the distortion of non-linear amplifier 11 in the case where address of ROM 14 is X and write the distortion-compensating data Re and Im which is obtained on the basis of the the distortion to ROM 14 as a data in the address X in advance.

As explained above, according to this embodiment, it is possible to perform a proper compensation for a distortion even when a gain of variable gain amplifier 10 varies, because a product of a gain of variable gain amplifier 10 and an amplitude of the input signal Sr, which product is proportional to an instantaneous level of an input signal of non-linear amplifier 11, is used as an address of ROM 14 which outputs a distortion-compensating data.

[Second Embodiment]

The second embodiment employs another method for compensating a gain variation of variable gain amplifier 10.

Figure 2:
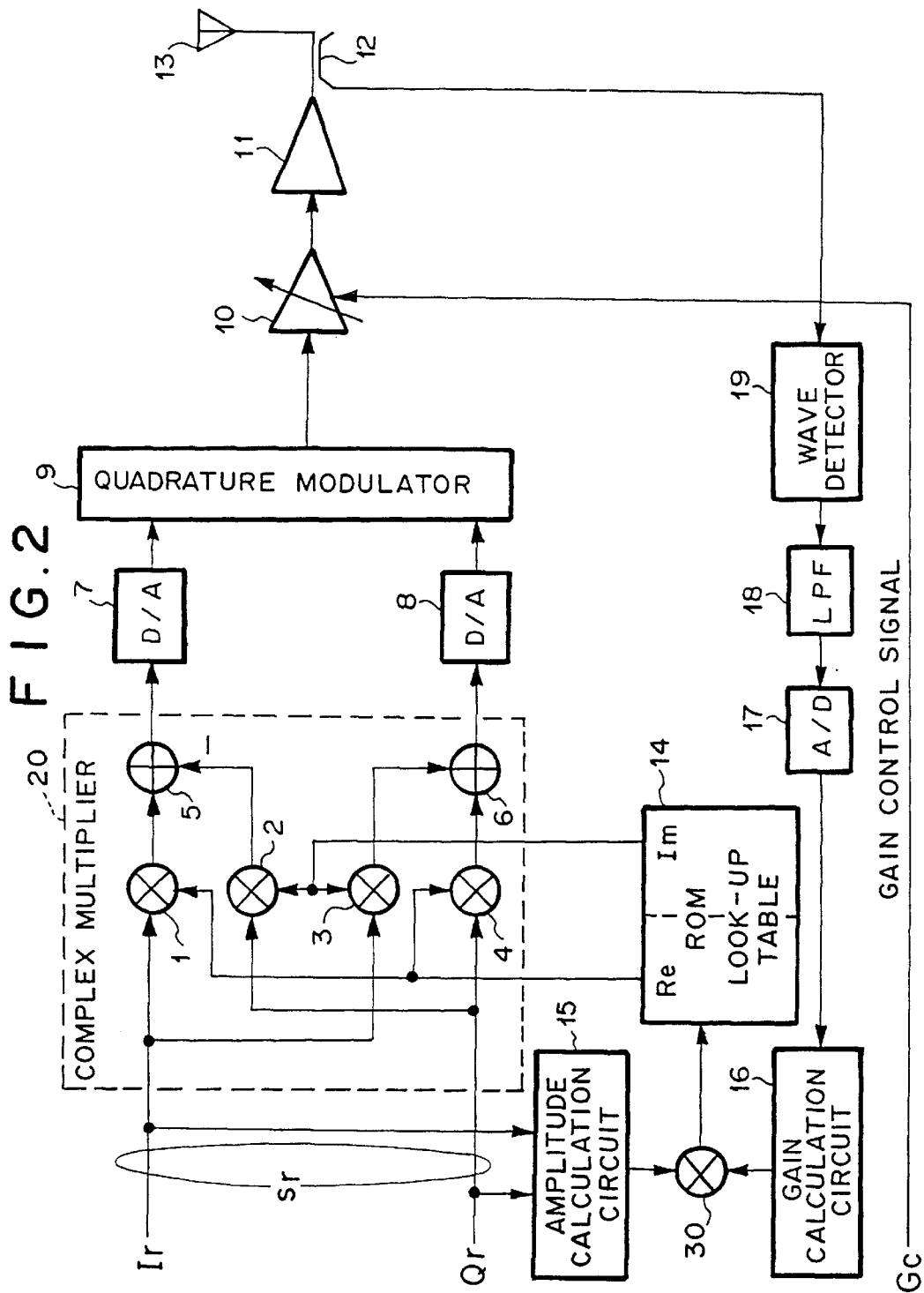
FIG. 2 is a block diagram showing a second embodiment of a predistorter according to the present invention.
Figure 3:
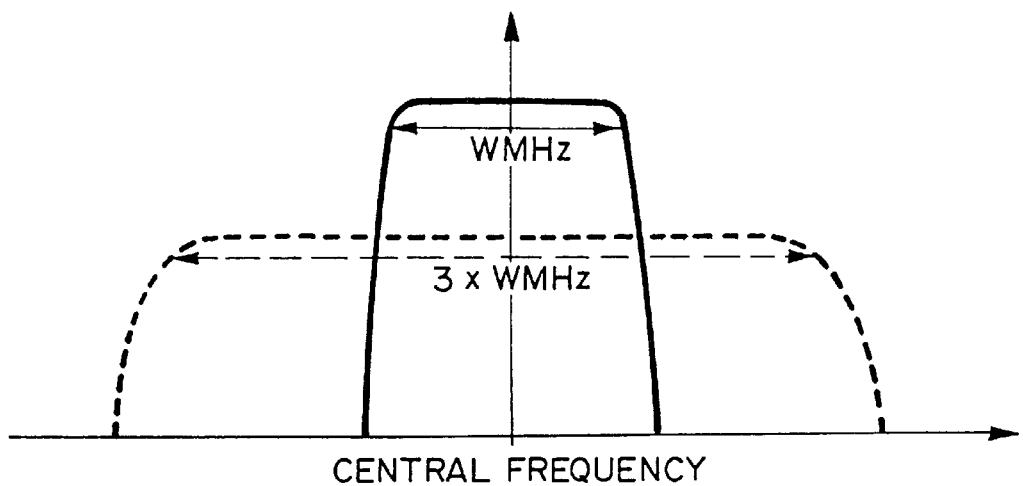
FIG. 3 is a spectrum diagram showing an example of an output spectrum in the case where an amplifier with a poor linearity is used.
Figure 4:
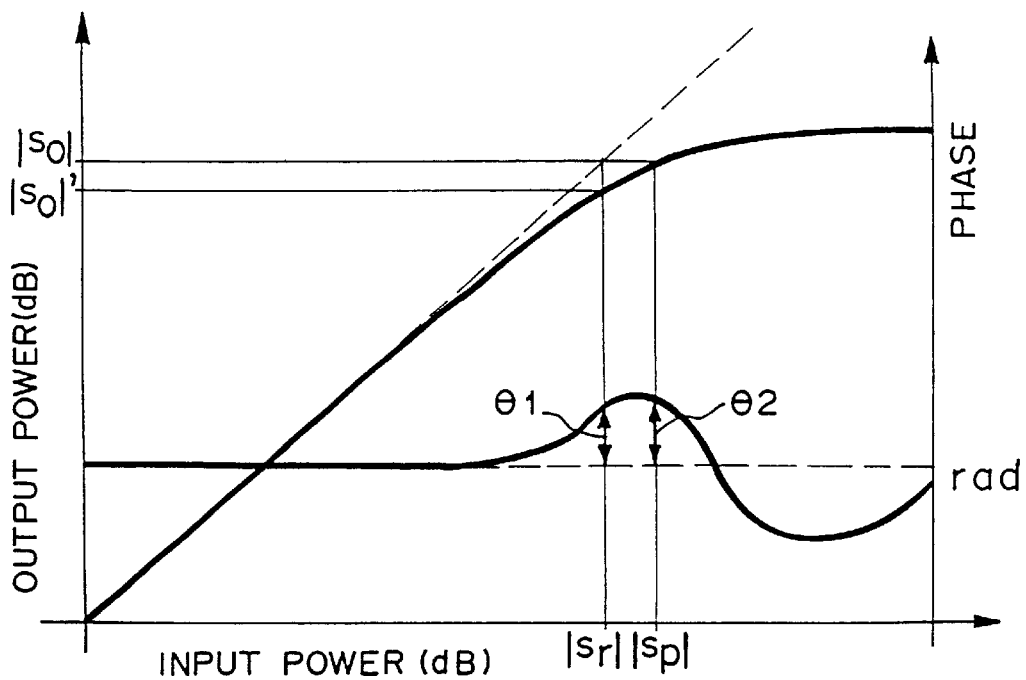
FIG. 4 is a diagram showing an example of a distortion of a transmission power amplifier.
Figure 5:
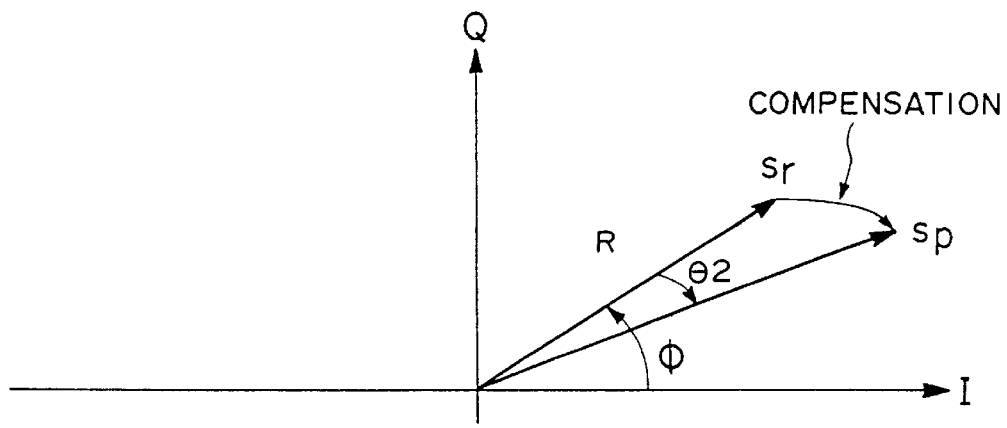
FIG. 5 is a complex plane for explaining the compensation of a distortion carried out by a predistorter.
Figure 6:
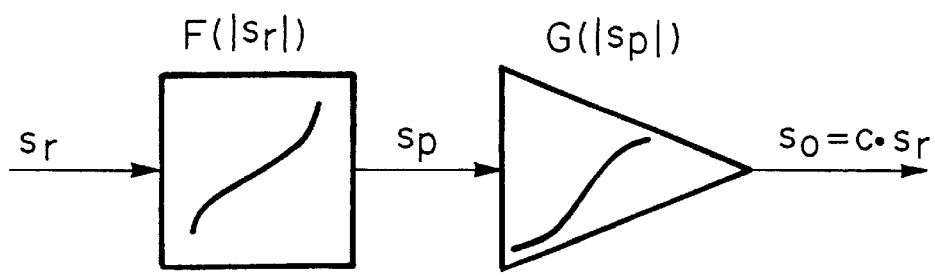
FIG. 6 is a block diagram for explaining the formulation of the compensation of the distortion as shown in FIG. 5.
Figure 7:
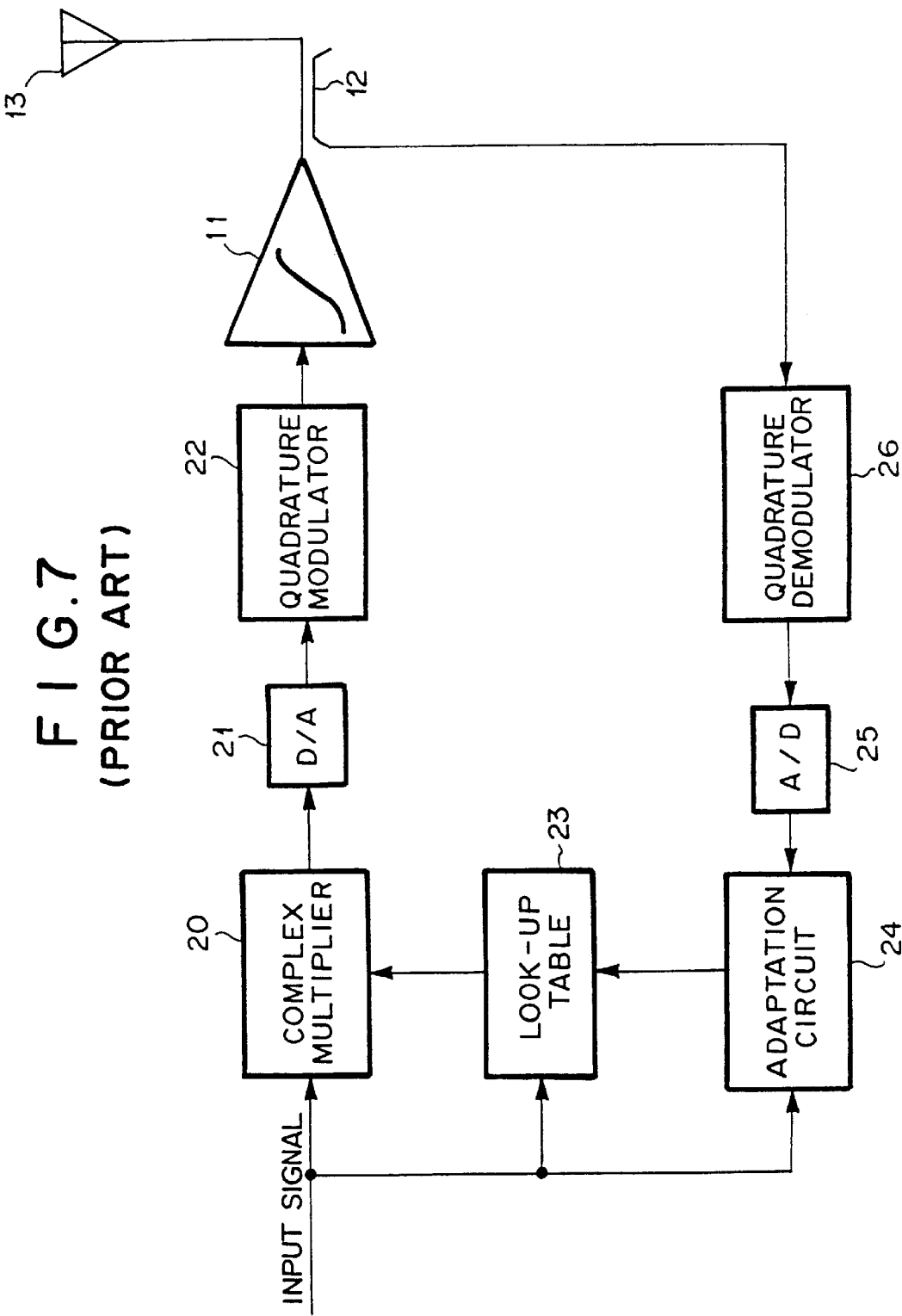
FIG. 7 is a block diagram showing a first conventional predistorter.
Figure 8:
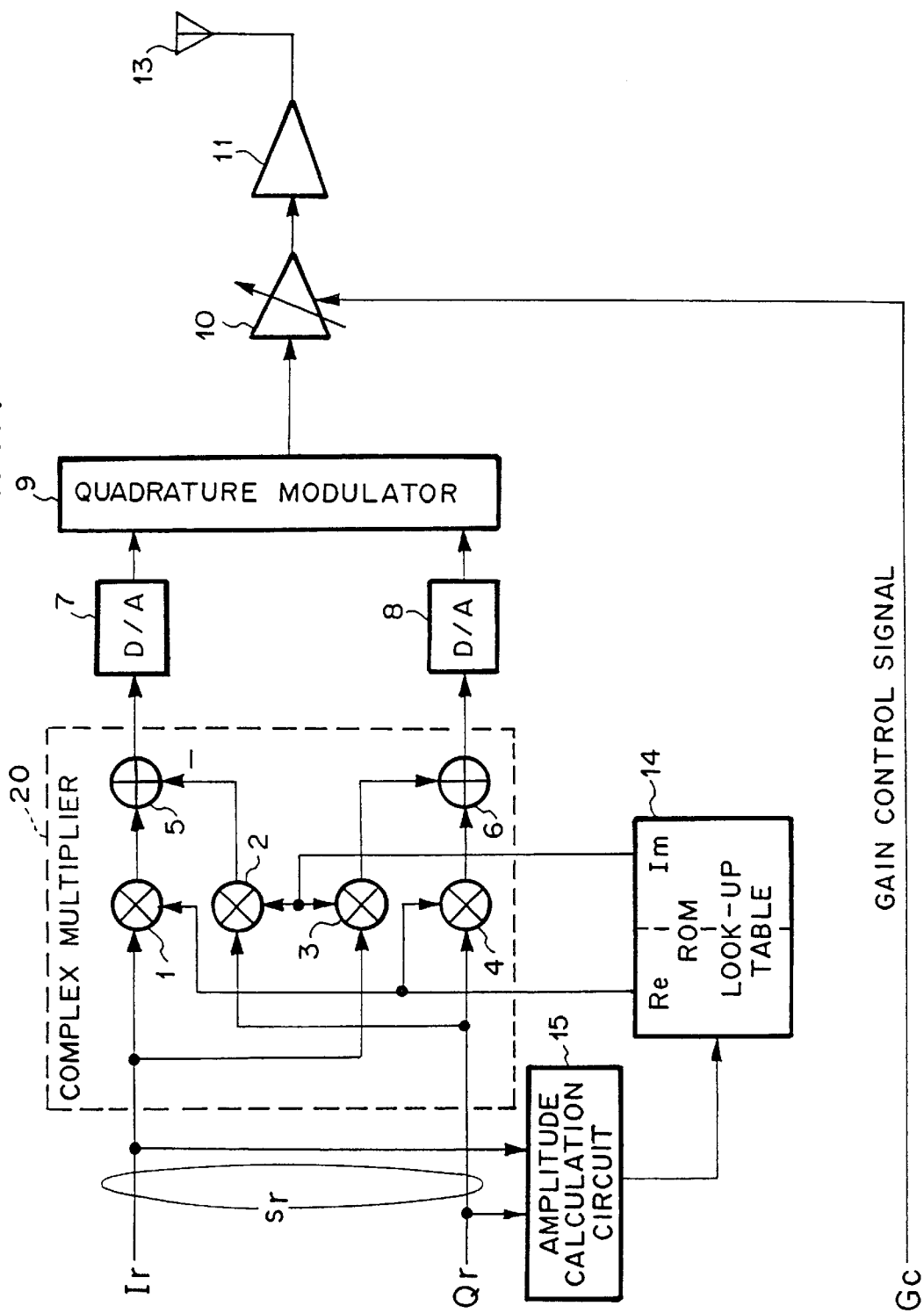
FIG. 8 is a block diagram showing a second conventional predistorter.

As shown in FIG. 2, this embodiment comprises: amplitude calculation circuit 15 which calculates an amplifier of an input signal $S_r$ using a baseband signal $I_r$ which is an in-phase component of the input signal $S_r$ with respect to a transmission carrier and a baseband signal $Q_r$ which is a quadrature component of the input signal $S_r$ with respect to the transmission carrier; ROM 14 in which a real part Re and imaginary part Im of a predistortion function are stored and which outputs a prescribed distortion-compensating data; complex multiplier 20 which comprises four multipliers 1 through 4 and two adders 5 and 6 and which multiplies a distortion-compensating data outputted from ROM 14 with the input signal $S_r$ by complex multiplication; digital-to-analog converters 7 and 8 which convert a result of multiplication in complex multiplier 20 to analog signals and output the analog signals; quadrature modulator 9 which modulates the analog signals outputted from digital-to-analog converters 7 and 8 by quadrature modulation and outputs a modulated signal as an RF signal; variable gain amplifier 10 which amplifiers the RF signal outputted from quadrature modulator 9 with a gain corresponding to a gain control signal supplied from the external and outputs the amplified RF signal; non-linear amplifier 11 which amplifies the amplified RF signal outputted from variable gain amplifier 10 and outputs an RF signal amplified therein; coupler 12 which shunts the amplified RF signal outputted from non-linear amplifier 11 into two RF signals; antenna 13 which transmits one of the signals shunted by coupler 12 as a radio wave; wave detector 19 which detects the other of the signals shunted by coupler 12; low pass filter 18 which filters a voltage obtained by wave detector 19 with a cut-off frequency sufficiently low to eliminate an instantaneous amplitude variation but allowing the frequency of transmission power control to pass therethrough; analog-to-digital converter 17 which converts a signal which passed low pass filter 18 to a digital signal and outputs the digital signal; gain calculation circuit 16 which calculates the gain of variable gain amplifier 10 on the basis of the digital signal outputted from analog-to-digital converter 17; and multiplier 30 which multiplies the amplitude calculated in amplitude calculation circuit 15 with the gain calculated in gain calculation circuit 16. ROM 14 outputs the distortion-compensating data in response to the result of multiplication in multiplier 30 which is used as an address thereof.

In the predistorter having the structure as explained above, the signal outputted from non-linear amplifier 11 is shunted into two signals by coupler 12, and one of the two signals is inputted to and detected by wave detector 19.

In low pass filter 18, the voltage obtained in wave detector 19 is filtered with the above mentioned cut-off frequency. The voltage thus obtained is approximately proportional to the average output amplitude of non-linear amplifier 11.

The signal which passed through low pass filter 18 is converted to the digital signal by analog-to-digital converter 17, and thereafter, a gain compensation value A is calculated in gain calculation circuit 16.

Unlike the first embodiment, in the second embodiment, it is needless to execute conversion from a dB value to an actual value in connection with the gain of variable gain amplifier 10, because the output of analog-to-digital converter 17 is approximately proportional to the average output amplitude of non-linear amplifier 11.

Thereafter, multiplier 16 multiplies the value of A calculated in gain calculation circuit 16 with an instantaneous amplitude $|S_r|$ of the input signal $S_r$ in order to obtain a product equivalent to address X of the first embodiment. The product is also proportional to an instantaneous amplitude of the transmission power.

In the case where a gain of variable gain amplifier 10 or any other circuit varies in conjunction with variation in ambient temperature, it is difficult for the first embodiment to accurately compensate the non-linearity of non-linear amplifier 11, whereas, in such a case, it is easy for the second embodiment to accurately compensate the non-linearity of non-linear amplifier 11 as long as wave detector 19, low pass filter 18, and analog-to-digital converter 17 stably operate, because it is possible to eliminate the influence of variation in ambient temperature. In actual, it is much easier to manufacture stable wave detector 19, low pass filter 18, and analog-to-digital converter 17 as compared with to manufacture stable variable gain amplifier 10.

As explained above, according to the present invention, it is possible to properly compensate a non-linearity of a non-linear amplifier even when a gain of a variable gain amplifier varies, because adopted is such structure in which a gain of the variable gain amplifier is obtained, the gain is multiplied with an amplitude of an input signal to obtain a pruduct which is proportional to an instantaneous input level of the non-linear amplifier, a value of a predistortion function is obtained in accordance with the product, and the input signal is predistorted with the value of the predistortion function.

Although the present invention has been shown and explained with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A predistorter for preliminarily a compensating a distortion caused in a circuit comprising a modulator, a variable gain amplifier, and a non-linear amplifier, said predistorter comprising:

an amplitude calculation circuit for detecting an amplitude of an input signal;

a gain calculation circuit for detecting a gain of said variable gain amplifier;

a first multiplier for multiplying the amplitude of the input signal with the gain of said variable gain to output a product therebetween;

a generator for generating a predistortion function corresponding to the product;

and a second multiplier for multiplying the input signal with the predistortion function to output a product therebetween to said modulator.

2. The predistorter according to claim 1, wherein said gain calculation circuit detects the gain of said variable gain amplifier on the basis of a gain control signal for said variable gain amplifier.

3. The predistorter according to claim 1, wherein said gain calculation circuit detects the gain of said variable gain amplifier on the basis of an output of said non-linear amplifier.

4. The predistorter according to claim further 3, comprising:

a coupler for generating a shunt signal from an output of said non-linear amplifier;

a wave detector for detecting the shunt signal to output a detected signal; and a low pass filter for filtering the detected signal to output a filtered signal;

wherein said gain calculation circuit detects the gain of said variable gain amplifier on the basis of the filtered signal.

5. The predistorter according to claim 4, further comprising:

an analog-to-digital converter inserted between said low pass filter and said gain calculation circuit and for converting the filtered signal to a digital signal;

wherein said gain calculation circuit detects the gain of said variable gain amplifier on the basis of the digital signal.

6. The predistorter according to claim 1, wherein said input signal is represented in a complex number;

said amplitude calculation circuit detects the amplitude of the input signal by using a real part and imaginary part of the input signal;

said generator generates the predistortion function represented in a complex number;

said second multiplier is a complex multiplier; and said modulator is a quadrature modulator.

7. The predistorter according to claim 6, further comprising:

two digital-to-analog converters inserted between said second multiplier and said modulator;

wherein the input signal is represented in a digital number; and said amplitude calculation circuit, said gain calculation circuit, said first and second multiplier, and said generator operate in digital.

8. The predistorter according to claim 1, further comprising:

a digital-to-analog said converter inserted between second multiplier and said modulator;

wherein the input signal is represented in a digital number; and said amplitude calculation circuit, said gain calculation circuit, said first and second multiplier, and said generator operate in digital.

9. The predistorter according to claim 1, wherein said generator comprises a look-up table.

10. The predistorter according to claim 9, wherein said look-up table comprises a read only memory.

11. A method for preliminarily compensating a distortion caused in a circuit comprising a modulator, a variable gain amplifier, and a non-linear amplifier, said method comprising steps of:

calculating an amplitude of an input signal;

calculating a gain of said variable gain amplifier;

multiplying the amplitude of the input signal with the gain of said variable gain to output a product therebetween;

generating a predistortion function corresponding to the product; and input multiplying the signal with predistortion the function to output a product therebetween to said modulator.

12. The method according to claim 11, wherein the gain of said variable gain amplifier is calculated on the basis of a gain control signal for said variable gain amplifier.

13. The method according to claim 11, wherein the gain of said variable gain amplifier is calculated on the basis of an output of said non-linear amplifier.

14. The method according to claim 13, further comprising steps of:

generating a shunt signal from an output of said nonlinear amplifier;

detecting the shunt signal to output a detected signal; and filtering the detected signal to output a filtered signal;

wherein the gain of said variable gain amplifier is detected on the basis of the filtered signal.

15. The method according to claim 14, further comprising a step of:

converting the filtered signal to a digital signal;

wherein the gain of said variable gain amplifier is detected on the basis of the digital signal.

16. The method according to claim 11, wherein said input signal is represented in a complex number;

the amplitude of the input signal is calculated by using a real part and imaginary part of the input signal;

the predistortion function is represented in a complex number;

said step of multiplying the input signal with the predistortion function is a complex multiplication; and said modulator is a quadrature modulator.

17. The method according to claim 11, further comprising a step of:

converting the result of multiplying the input signal with the predistortion function to an analog signal;

wherein the input signal is represented in a digital number; and said step of detecting the amplitude of the input signal, said step of detecting the gain of said variable gain amplifier, said step of multiplying the amplitude of the input signal with the gain of said variable gain, said step of generating the predistortion function corresponding to the product; and said step of multiplying the input signal with the predistortion function, are performed digitally.

18. A transmitter comprising:

the predistorter claimed in any one of claims 1 through 10, a modulator for modulating an output of said predistorter;

a variable gain amplifier for amplifying an output of said modulator;

a non-linear amplifier for amplifying an output of said variable gain amplifier; and an antenna for transmitting an output of said non-linear amplifier as a radio wave.

19. A radio communication apparatus comprising the transmitter claimed in claim 18.

* * * * *